(12) United States Patent
Staszewski et al.

(10) Patent No.: US 7,427,940 B2
(45) Date of Patent: Sep. 23, 2008

(54) TIME-TO-DIGITAL CONVERTER WITH NON-INVERTING BUFFERS, TRANSMISSION GATES AND NON-LINEARITY CORRECTOR, SOC INCLUDING SUCH CONVERTER AND METHOD OF PHASE DETECTION FOR USE IN SYNTHESIZING A CLOCK SIGNAL

(75) Inventors: Robert Bogdan Staszewski, Garland, TX (US); Dirk Leipold, Plano, TX (US); Wei Chen, San Diego, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/690,506

(22) Filed: Mar. 23, 2007

(65) Prior Publication Data

US 2008/0157839 A1     Jul. 3, 2008

Related U.S. Application Data

(60) Provisional application No. 60/882,886, filed on Dec. 29, 2006.

(51) Int. Cl.
*H03M 1/12* (2006.01)
*H03L 7/06* (2006.01)
(52) U.S. Cl. .................. 341/155; 327/269; 327/272; 341/157

(58) Field of Classification Search .................. 327/269, 327/271, 272, 392, 393, 394; 341/155, 157, 341/166
See application file for complete search history.

(56) References Cited

U.S. PATENT DOCUMENTS

| | | | | |
|---|---|---|---|---|
| 6,429,693 | B1 * | 8/2002 | Staszewski et al. | ......... 327/158 |
| 7,046,098 | B2 | 5/2006 | Staszewski | |
| 7,183,860 | B2 | 2/2007 | Staszewski et al. | |
| 2002/0005746 | A1 * | 1/2002 | Kondo | ......... 327/278 |

(Continued)

OTHER PUBLICATIONS

Staszewski, R.B. et al.; Time-to-digital converter for RF frequency synthesis in 90 nm CMOS; 2005 IEEE Radio Frequency integrated Circuits (RFIC) Symposium; Jun. 12-14, 2005, pp. 473-476.*

(Continued)

*Primary Examiner*—Howard Williams
(74) *Attorney, Agent, or Firm*—Ronald O. Neerings; Wade James Brady, III; Frederick J. Telecky, Jr.

(57) ABSTRACT

A time-to-digital converter (TDC), a system-on-chip including a TDC, a method of phase detection for use in synthesizing a clock signal and a non-linearity corrector for a TDC. In one embodiment, the TDC includes a chain of delay elements configured to receive a clock signal and generate delayed clock signals. Each one of the delay elements includes: (1) a non-inverting buffer configured to delay the clock signal by about twice a delay of an inverter to provide a buffer-delayed clock signal and (2) a first transmission gate coupled to the non-inverting buffer and configured to delay the clock signal by about the delay of an inverter to provide a first gate-delayed clock signal.

24 Claims, 6 Drawing Sheets

U.S. PATENT DOCUMENTS

2006/0103566 A1   5/2006   Vemulapalli et al.
2007/0146024 A1*  6/2007   Allan .......................... 327/156

OTHER PUBLICATIONS

Staszewski, et al., All-Digital PLL and Transmitter for Mobile Phones, IEEE Journal of Solid-State Circuits, vol. 40, No. 12, Dec. 2005, pp. 2469-2482.

Staszewski, et al., 1.3 V 20 ps Time-to-Digital Converter for Frequency Synthesis in 90-mm CMOS, IEEE Transactions on Circuits and Systems—II: Express Brief, vol. 53, No. 3, Mar. 2006, pp. 220-224.

* cited by examiner

TIME-TO-DIGITAL CONVERTER WITH NON-INVERTING BUFFERS, TRANSMISSION GATES AND NON-LINEARITY CORRECTOR, SOC INCLUDING SUCH CONVERTER AND METHOD OF PHASE DETECTION FOR USE IN SYNTHESIZING A CLOCK SIGNAL

CROSS REFERENCE TO PROVISIONAL APPLICATION

This claims the benefit of U.S. Provisional Application No. 60/882,886 entitled "TIME-TO-DIGITAL CONVERTER WITH NON-INVERTING BUFFERS, TRANSMISSION GATES AND NON-LINEARITY CORRECTOR, SOC INCLUDING SUCH CONVERTER AND METHOD OF PHASE DETECTION FOR USE IN SYNTHESIZING A CLOCK SIGNAL" filed on Dec. 29, 2006, by Robert Bogdan Staszewski, et al., and incorporated herein by reference in its entirety.

TECHNICAL FIELD OF THE INVENTION

The invention is directed, in general, to a time-to-digital converter (TDC) and, more specifically, to a TDC that employs non-inverting delays and transmission gates and performs post-processing of a TDC output to calibrate for delay mismatches.

BACKGROUND OF THE INVENTION

TDCs are widely used for time interval measurements in space science, high-energy physics, laser range finders and test instrumentation. Recently, TDCs have been used for frequency synthesis in delay locked loops (DLLs) for faster acquisition and to avoid false locking. With the advent of digitally-intensive and all-digital phase locked loops (AD-PLLs) in deep-submicrometer CMOS, the TDC is becoming an attractive replacement of the conventional phase/frequency detector and charge pump. This also allows to replace the loop filter that requires large and leaky integrating capacitors with a simple digital filter.

Recently, TDC-based frequency synthesizers have been used in fully-compliant Global System for Mobile Communications (GSM)/EDGE transceivers in 90-nm CMOS. The TDC is specifically employed in these transceivers to measure edge time difference between the 1.6-2.0-GHz high-speed complementary clocks (HCLKs) and the 26-MHz frequency reference (FREF) clock.

Typically, the current implementation of TDCs in digital radio frequency processors (DRP) use inverter gates as delay elements and complementary or pseudo-differential D flip-flops to latch the output of the delayed elements. In deep submicron, inverter gates have very short delay (typically about 20 psec) and hence TDC has high resolution. However, the inverting of the polarity across each stage may result in design and layout issues unless extensive layout, matching, corner simulation and lab characterization efforts are undertaken. Such issues include uneven and varying transition times across process, voltage and temperature (PVT) of the rising and falling edges of the delayed clock vector signal and unbalanced metastability resolution of the flip-flops, which can upset the even-odd characteristic of the TDC resolution.

Accordingly, what is needed in the art is a TDC that offers similar timing resolution as an inverter based TDC but without inverting the polarity of the signals.

SUMMARY OF THE INVENTION

To address the above-discussed deficiencies of the prior art, the invention provides a TDC, a system-on-chip (SOC) including a TDC, a method of phase detecting for synthesizing a clock signal and a non-linearity corrector for a TDC. In one embodiment, the TDC includes a chain of delay elements configured to receive a clock signal and generate delayed clock vector signals. Each one of the delay elements includes: (1) a non-inverting buffer configured to delay the clock signal by about twice a delay of an inverter to provide a buffer-delayed clock signal and (2) a first transmission gate coupled to the non-inverting buffer and configured to delay the clock signal by about the delay of an inverter to provide a first gate-delayed clock signal.

In another aspect, the invention provides a SOC. In one embodiment, the SOC includes a TDC having a chain of delay elements configured to receive a clock signal and generate delayed clock vector signals. Each one of the delay elements including: (1) a non-inverting buffer configured to delay the clock signal by about twice a delay of an inverter to provide a buffer-delayed clock signal; and (2) a first transmission gate coupled to the non-inverting buffer and configured to delay the clock signal by about the delay of an inverter to provide a first gate-delayed clock signal.

In yet another aspect, the invention provides a method of phase detection for use in synthesizing a clock signal. In one embodiment the method includes: (1) receiving a clock signal at a node, (2) employing a non-inverting buffer to delay the clock signal at the node by about twice a delay of an inverter and provide a buffer-delayed clock signal and (3) employing a transmission gate to delay the clock signal at the node by about a delay of an inverter and provide a gate-delayed clock signal.

In still another aspect, the invention provides a non-linearity corrector for use with a TDC that receives a clock signal and a frequency reference clock signal. In one embodiment, the non-linearity corrector includes: (1) an adder configured to receive a normalized output from a TDC and (2) a corrector applier coupled to the adder and configured to provide a correcting factor to the normalized output based on a raw output of the TDC, wherein the correcting factor is based on a TDC transfer function mismatch.

In yet an additional aspect, the invention provides an embodiment of a TDC, including: (1) a chain of non-inverting buffers configured to receive a clock signal and generate delayed clock signals, wherein each of the non-inverting buffers are configured to provide a delay of about twice a delay of an inverter to provide a buffer-delayed clock signal and (2) an array of transmission gates, coupled to the chain of non-inverting buffers, configured to provide a delay of about the delay of an inverter to provide a transmission-gate-delayed clock signal.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
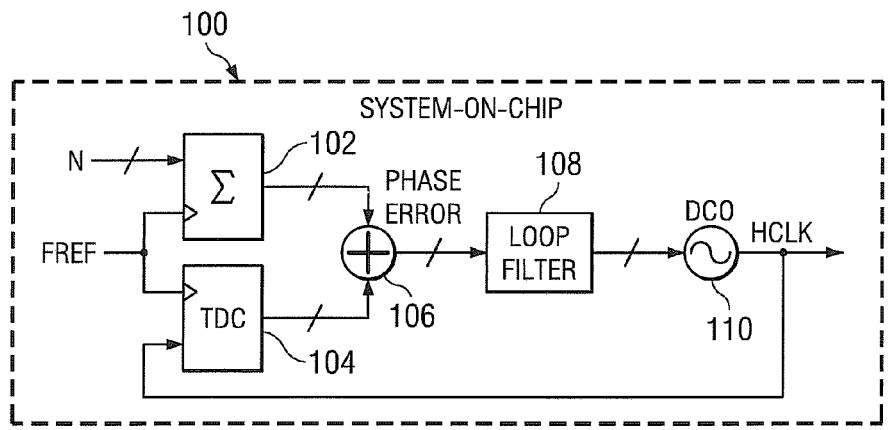
FIG. 1 illustrates a block diagram of an embodiment of a SOC having a phase locked loop constructed according to the principles of the invention.

FIG. 1 illustrates a block diagram of an embodiment of a system-on-chip (SOC) having a phase locked loop (PLL) 100 constructed according to the principles of the invention. The PLL 100 includes a TDC system 104, a reference phase accumulator 102, a phase detector 106, a loop filter 108 and a digitally controlled oscillator (DCO) 110. The TDC system 104 may be used as a replacement for a phase/frequency detector and a charge pump in an ADPLL based RF frequency synthesizer. The ADPLL based RF frequency synthesizer may be used, for example, as a TDC-based frequency synthesizer of a fully-compliant Global System for Mobile Communications (GSM)/EDGE transceiver in 90-nm CMOS.

The TDC system 104 receives the frequency reference clock signal (FREF), derived from a crystal oscillator, and the HCLK high-speed variable clock signal from the DCO 110. The TDC system 104 measures the timestamp of the frequency reference clock signal FREF by measuring the edge timing difference between the 1.6-2.0 GHz high-speed PLL clock HCLK and the much lower speed 26 MHz frequency reference clock signal FREF. The TDC system 104 may operate as the TDC system disclosed in FIG. 10 of U.S. patent application Ser. No. 11/274,965, which is incorporated herein by reference in its entirety. The TDC system 104 includes a power management system and a TDC core (neither illustrated). The power management system saves power when the rising edge of FREF is expected to be sufficiently away by gating off the HCLK clock signal. The TDC core may be a TDC core as disclosed in the above referenced U.S. patent application Ser. No. 11/274,965. Additionally, the TDC core 200 may be one of the TDC cores illustrated in FIG. 2A or 3A below. In some embodiments, the TDC core is an adjusted TDC core that will be discussed in more detail with respect to FIG. 5.

Figure 2A:
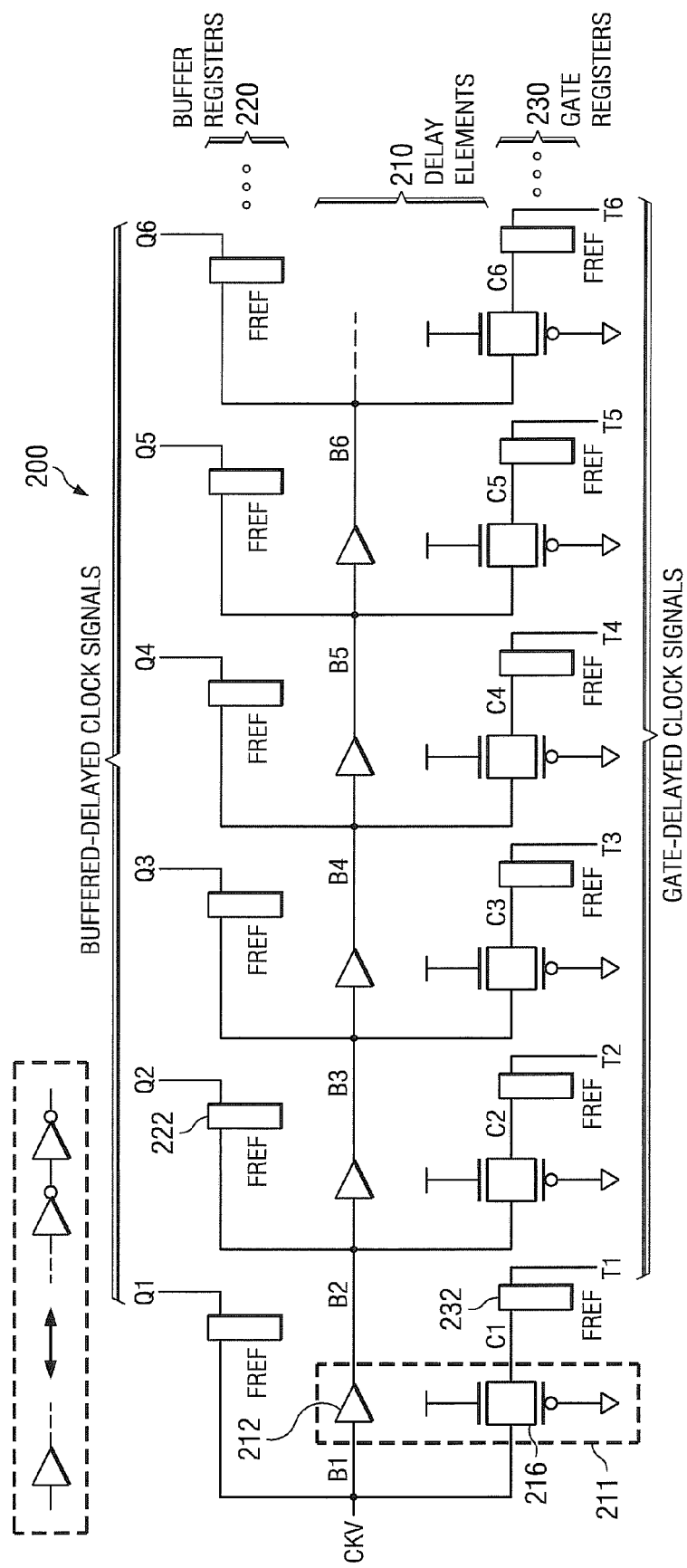
FIG. 2A illustrates a schematic diagram of an embodiment of a core of a TDC constructed according to the principles of the invention.

FIG. 2A is a schematic diagram of an embodiment of a core of the TDC 200 constructed according to the principles of the invention. The TDC 200 includes a string or chain of delay elements 210 (i.e., stages) configured to receive a high-speed variable clock (CKV or HCLK) signal and generate delayed clock signals. Each one of the delay elements 210 includes a non-inverting buffer and a transmission gate. One such delay element has been designated 211 in FIG. 2A to represent each of the delay elements 210 and includes non-inverting buffer 212 and transmission gate 216.

The CKV clock signal may be the HCLK clock signal as discussed above with respect to FIG. 1. The non-inverting buffer 212 internally includes two inverters and delays the clock signal by about twice a delay of an inverter to provide a buffer-delayed clock signal represented by B2 (represented by B2, B3, B4, . . . , when considering the delay elements 210). The transmission gate 216, coupled to the non-inverting buffer 212, delays the clock signal by about the delay of an inverter to provide a gate-delayed clock signal represented by C1 (represented by C1, C2, C3, C4, . . . , when considering the delay elements 210).

Each of the buffered delayed clock signals are latched by a buffer register 220. Each of the gate delayed clock signals are latched by a gate register 230. For example, buffer register 222 latches the output of non-inverting buffer 212 and gate register 232 latches the output of transmission gate 216. The buffer registers 220 and the gate registers 230 may be D flip-flops or transparent latches.

Figure 2B:
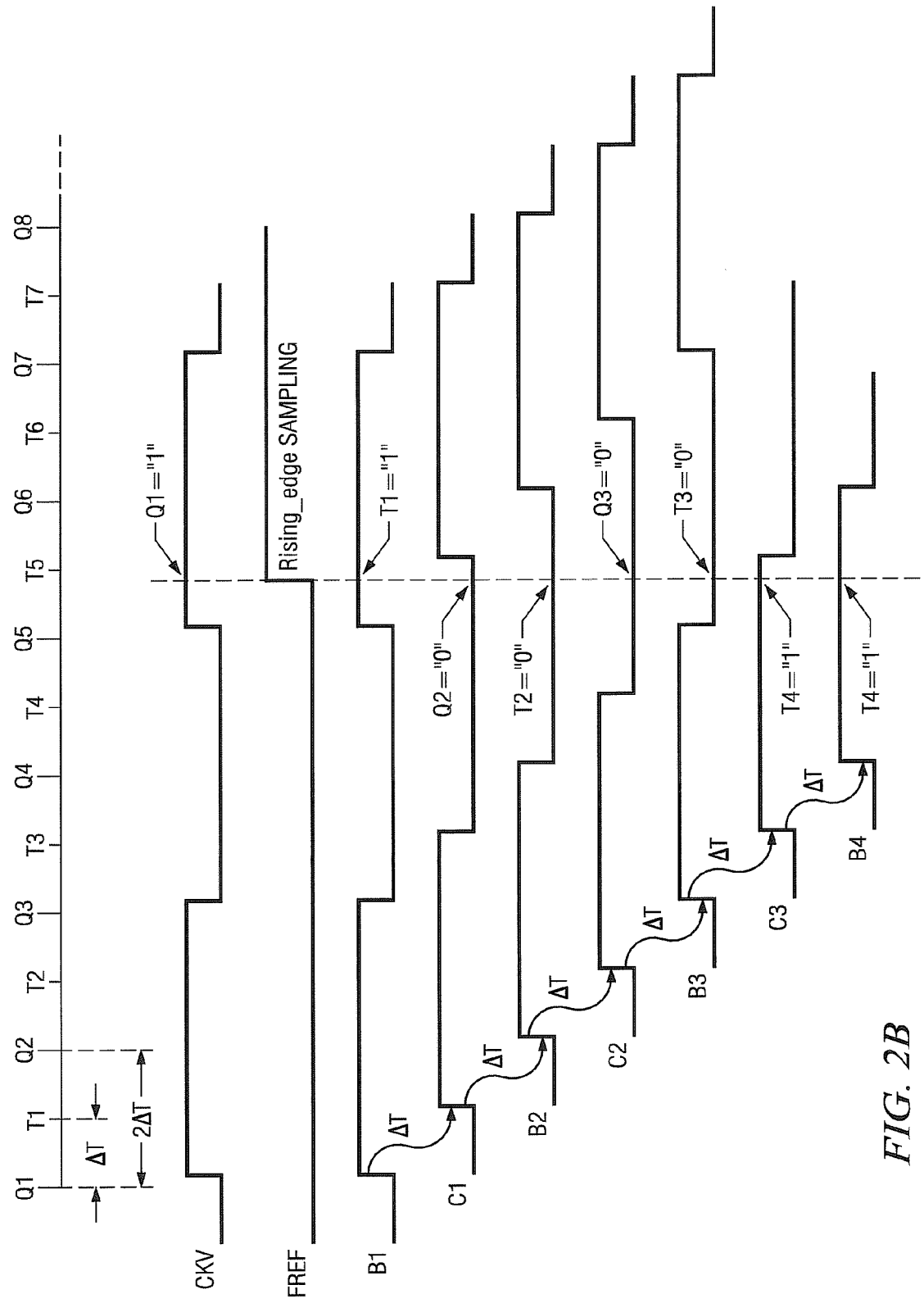
FIG. 2B illustrates a timing diagram of the TDC of FIG. 2B.

The non-inverting buffers provide regeneration of the clock signal, while the transmission gates provide finer timing resolution similar to an inverter but without regenerating the clock signal. The configuration of the TDC 200 allows non-inverting nodes to be latched into the buffer registers 220 and, through a transmission gate delay, by the gate registers 230. As illustrated, the TDC 200 includes a chain of buffer elements, which provide a delay resolution of about twice the delay resolution of an inverter ($2\Delta T$, where $\Delta T$ is the resolution of a would-be inverter). For a 2.5 GHz VCO, a typical number of stages of buffers are approximately 24. Not all of the stages are illustrated in FIG. 2A. Of course, a different number of stages may be used depending on the implementation of the TDC core 200. In order to make delay resolution as fine as $\Delta T$, the transmission gates at each node of the chain provide the $\Delta T$ delay as shown in FIG. 2B. The delay points (T1, T2, T3, T4, . . . ) are latched by gate registers 230. Since all of the signals are non-inverted, the delay timing is much more robust against process variation, temperature variation and voltage variation and their effects on the rising/falling edge balance.

The waveform indicating the operation of the TDC core 200 is illustrated in FIG. 2B. The delay between a buffered-delayed clock signal and a gate-delayed clock signal is represented by $\Delta T$. The buffer registers 220 and the gate registers 230 latch the output data from the TDC core 200 at the rising edge of the FREF. The latched-outputs from the buffer registers 220 and the gate registers 230 are employed to calculate the TDC output. As shown in the waveform, the eight latched values are "10000011."

Figures 3A, 3B:
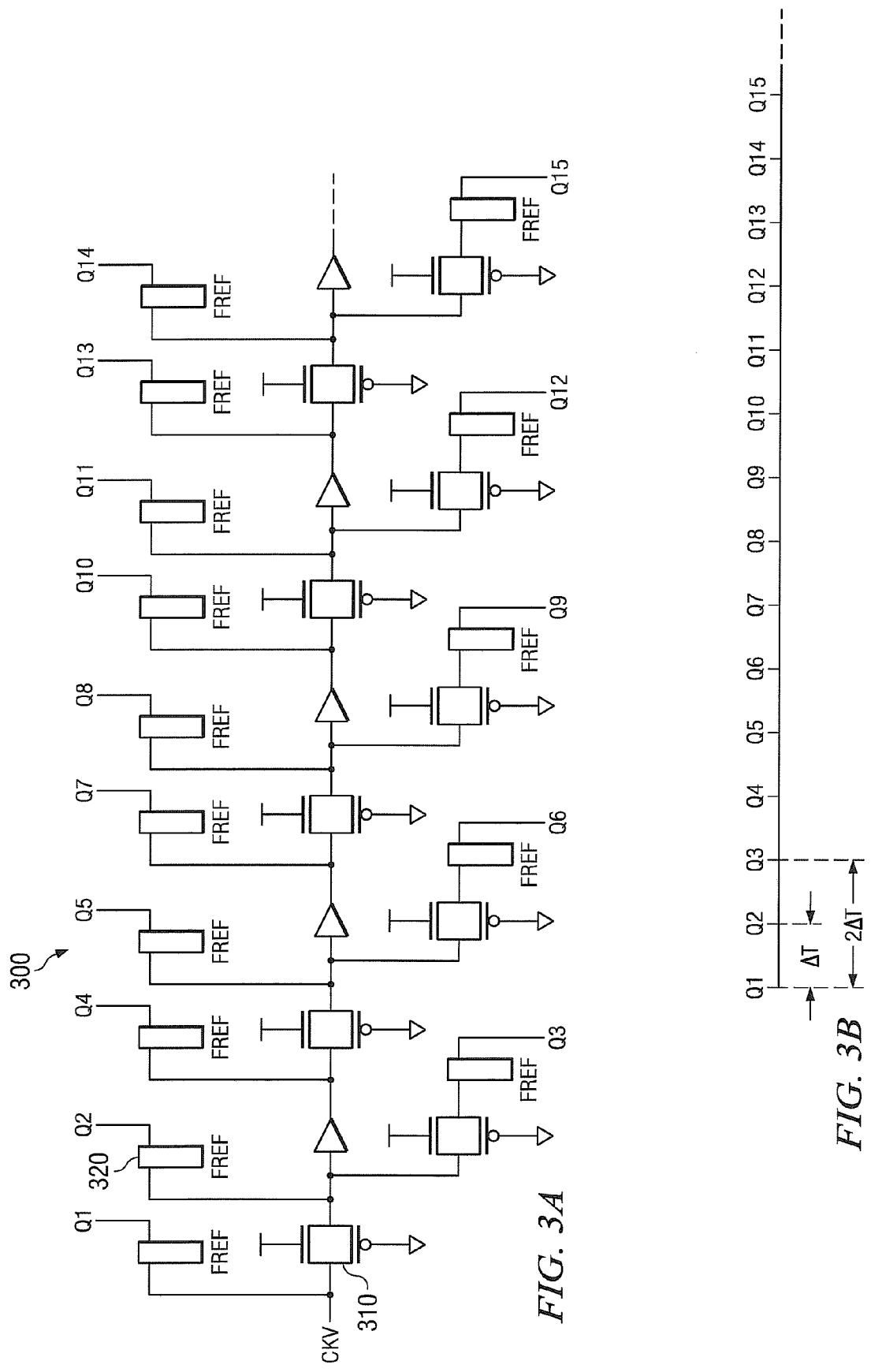
FIG. 3A illustrates a schematic diagram of a second embodiment of a core of a TDC constructed according to the principles of the invention.
FIG. 3B illustrates a timing diagram of the TDC of FIG. 3A.

FIG. 3A illustrates a second embodiment of a TDC core 300 constructed according to the principles of the invention. The TDC core 300 includes the delay elements, the buffer registers and the gate registers as illustrated in FIG. 2A. Additionally, the TDC core 300 includes interleaving transmission gates with the non-inverting buffers in a chain, one of which is designated 310. Additional registers are also provided to latch the outputs of the interleaving transmission gates, one of which is designated 320. FIG. 3B illustrates the timings steps of the latched outputs.

Figure 4A:
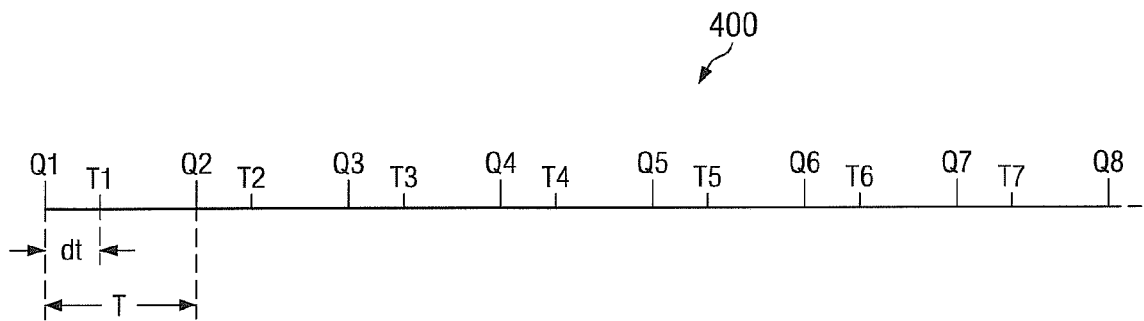
FIG. 4A illustrates a timing diagram representing the delay differences between transmission gates and buffers employed in a TDC.

Though the above embodiments of a TDC core use non-inverted signals which are more robust against PVT variation, in practice, it is still difficult to match transmission-gate delay with inverter-delay (or about half a non-inverting buffer delay) exactly across the entire PVT range. Accordingly, even-odd pre-distortion with calibration can be applied as indicated below. FIG. 4A illustrates timing steps representing the imperfect delays between transmission gates and buffers of a TDC core. As noted above, the delays of the transmission gates may not be exactly half of a delay of the non-inverting buffers. Accordingly, calibration and pre-distortion are needed.

In the presented embodiments, a first delay element is a buffer (i.e., a non-inverting buffer) whereas a second delay element is a transmission gate. In other embodiments, other delay elements may be employed. For example, in one embodiment, a first type of string-connected delay elements may exhibit a delay substantially larger than a second type of delay elements.

Figure 4B:
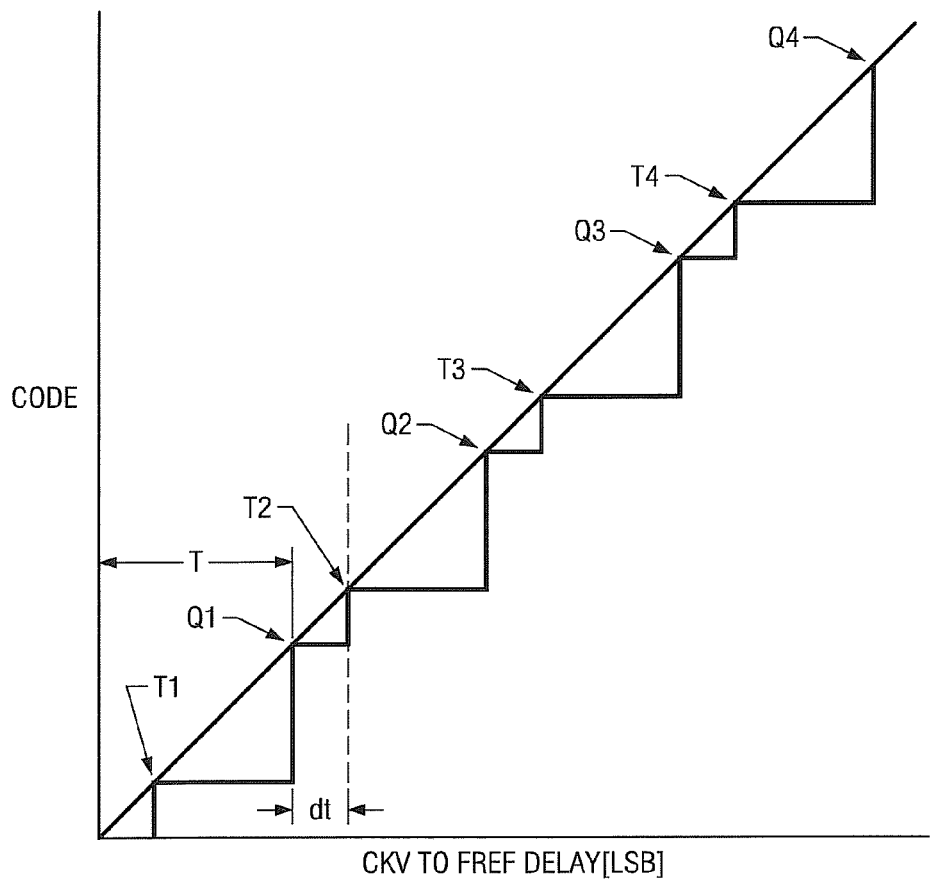
FIG. 4B is a graph representing a TDC transfer function of the output code of the TDC core represented in FIG. 4A versus a clock signal to reference clock signal delay.

FIG. 4B is a graph representing a TDC transfer function of an output code of a TDC core versus a clock signal to a reference clock signal delay. The output code of the TDC core is raw TDC output after customary conversion to binary from a pseudo-thermometer-code edge decoder. The clock signal may be HCLK or CKV and the reference clock signal may be FREF. As shown in the FIG. 4B, even-odd predistorted TDC timing steps consists of two interleaving periodic timing series, one from buffer outputs (Q1, Q2, Q3, . . . ) and the other from the transmission-gate series (T1, T2, T3, . . . ). Both periods are T. The offset, μ, is the ratio of dt/T and is a measure of the TDC transfer function mismatch which, in this case, is an even-odd mismatch. The slope of the graph, ε, represents the ratio of the delay to the output code of a TDC core. ε is calibrated and applied to the output code of a TDC core by a normalized TDC circuit 520 discussed below with respect to FIG. 5. μ is provided to the output code of a TDC core by the non-linearity corrector 540 of FIG. 5. Both ε and μ are determined and applied in order to improve correlation.

Figure 5:
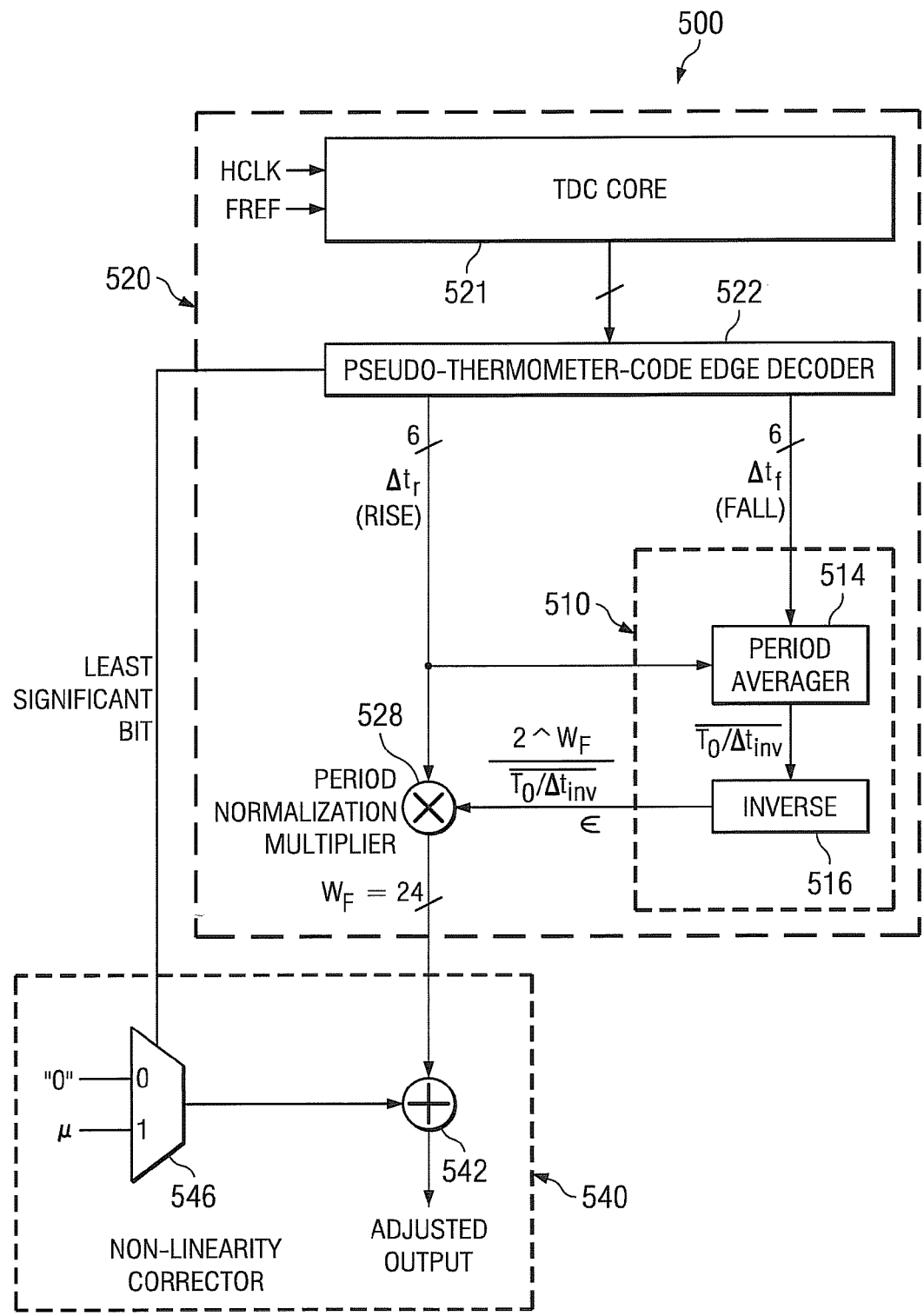
FIG. 5 illustrates a block diagram of an embodiment of an adjusted TDC constructed according to the principles of the invention

FIG. 5 illustrates a block diagram of an embodiment of an adjusted TDC core 500 constructed according to the principles of the invention. The adjusted TDC core 500 includes a normalized TDC circuit 520 and a non-linearity corrector 540. The normalized TDC circuit 520 includes a TDC calibration circuit 510 having a period averager 514 and an inverse block 516. The TDC calibration circuit 510 is adapted to provide on-line calibration (self calibration) as described in U.S. patent application Ser. No. 11/274,965 referenced above. The normalized TDC circuit 520 further includes a TDC core 521, pseudo-thermometer-code edge decoder 522 and a TDC output normalizer 528. The TDC core 521 may use transmission gates and non-inverter delays as discussed above with respect to FIGS. 2A and 3A. Alternatively, the TDC core 521 may be constructed using a chain of inverters as described in U.S. patent application Ser. No. 11/274,965 referenced above. Other topologies for the TDC core 521 may also be used.

As noted above, PVT and local variations in inverter delays cause problems when matching transmission-gate delays with inverter-delays across a PVT variation range. The normalized TDC circuit 520 provides self calibration during normal operation for the PVT variations in inverter delays. The normalized output generated by the normalized TDC circuit 520 is provided to the non-linearity corrector 540 for even-odd pre-distortion to improve the match between the delays of the transmission gates and the inverters. The non-linearity corrector 540 can also be used with a TDC core that does not include transmission gates to provide further correction for PVT and local variations.

The absolute difference between the measured rising edge and falling edge delays of HCLK to FREF ($\Delta t_r$ and $\Delta t_f$) is the half-period of HCLK in terms of number of inverters, i.e., half of $T_0/\Delta t_{inv}$. An accurate estimate of $T_0/\Delta t_{inv}$ may be obtained through averaging, with an error below 1%. Its inverse is used for the fixed-point period normalization multiplier, referred to as ε in FIG. 5, with WF=24 fractional bits of resolution. This value divided by the HCLK frequency, $1/T_0$, is the inverter delay $\Delta t_{inv}$ in units of seconds and is read out to give an indication of the CMOS process strength.

The non-linearity corrector 540 includes an adder 542 that receives a normalized output from the normalized TDC circuit 520. The non-linearity corrector 540 also includes a corrector applier 546 configured to provide a correcting factor μ to the adder 542 and, thus the normalized output, based on a raw output of the TDC core 521. As indicated in FIG. 5, the correcting factor μ is provided based on the least significant bit of the raw output. The correcting factor is based on, and may in fact be, a ratio of an offset between delayed signals of the clock signal and the frequency clock signal. As noted above, the offset, μ, is the ratio of dt/T and is a measure of the TDC transfer function mismatch which may be an even-odd mismatch.

Thus, after calibration by the TDC calibration circuit 510, the non-linearity corrector 540 adjusts the normalized output by adding the correcting factor, represented by μ, based on if the TDC raw integer (not normalized) output is even or odd. If even, the least significant bit of the TDC raw output is zero and μ is not added to the normalized output. If odd, the least significant bit of the TDC raw output is 1, and μ is added to the normalized output. Alternatively, −μ/2 or +μ/2 could be added if the TDC raw output is even or odd, respectively. Accordingly, the non-linearity corrector 540 provides an adjusted output from the TDC core that is calibrated and pre-distorted to compensate for PVT variation. The corrector applier 546 may be a multiplexer as illustrated in FIG. 5.

Figure 6:
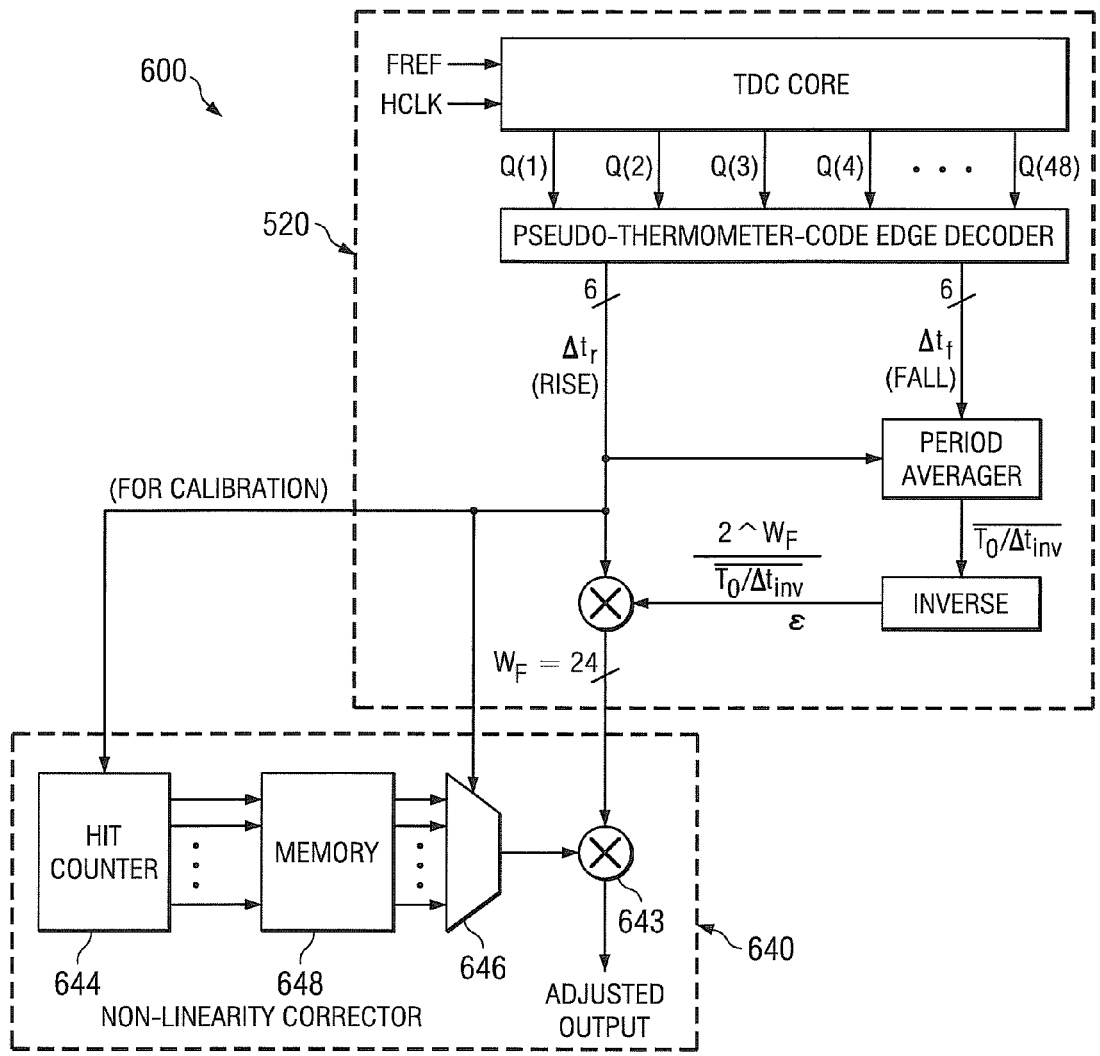
FIG. 6 illustrates a block diagram of another embodiment of an adjusted TDC constructed according to the principles of the invention.

The TDC core 521 could be constructed such that a non-linearity pattern other than an even/odd pattern may be exhibited. For example, a topology may be a matrix with N rows and M columns of delay elements. If the delay element chain spans in a zigzag manner first through the rows, then, due to the layout issues, the TDC transfer function will show a periodic mismatch pattern with a periodicity of M. Accordingly, a different correction to the even/odd described above should be used. In a general case of the TDC normalized output correction, the raw TDC output would select a correction out of a set of all possible TDC raw codes and add it to the normalized TDC output. In this case, instead of a single-bit selecting a 0 or μ input of the corrector applier 546, a multibit value of the raw TDC output would select inputs from a lookup table 648 (i.e., a memory) employing a corrector applier 646 (e.g., a multiplexer) of a non-linearity corrector 640 as illustrated in FIG. 6. The selected inputs would then be provided to a TDC output adjuster 643 to be added to the normalized TDC output. The calibration method to populate the lookup table 648 would be similar to the method described for the even-odd correction embodiment. The correcting factor for a specific TDC raw code would be established based on a relative occurrence of that specific code. The calibration could be done off-line, such as during factory calibration, or on-line based on a user data. A counter 644 of number of hits or occurrences could be maintained for each of the possible TDC codes. In addition to the non-linearity corrector 640, the adjusted TDC core 600 includes the normalized TDC circuit 520 as illustrated in FIG. 5.

Referring back to FIG. 4B, the even-odd transfer function mismatch could be calibrated by observing the ratio of hits between the even and odd valued codes of the raw TDC output. If the timing difference between the CKV and FREF clocks (i.e., x-axis) is sufficiently uniformly distributed, then the relative probabilities of hitting an even code versus an odd code depends on the even-odd mismatch. In case of no mismatch, the even and odd code probabilities are both 50%. In the FIG. 4B example, the probability of hitting the interval between Q1-T2 is much lower than that of T1-Q1. Therefore a positive correction to the normalized TDC output needs to be added in the Q1-T2 region.

Those skilled in the art to which the invention relates will appreciate that other and further additions, deletions, substitutions and modifications may be made to the described embodiments without departing from the scope of the invention.

What is claimed is:

1. A time-to-digital converter (TDC), comprising:
    a chain of delay elements configured to receive a clock signal and generate delayed clock signals, each one of said delay elements including:
        a non-inverting buffer configured to delay said clock signal by about twice a delay of an inverter to provide a buffer-delayed clock signal, and
        a first transmission gate coupled to said non-inverting buffer and configured to delay said clock signal by about said delay of an inverter to provide a first gate-delayed clock signal.

2. The TDC as recited in claim 1 further comprising a first register configured to latch said first gate-delayed clock signal and a second register configured to latch said buffer-delayed clock signal.

3. The TDC as recited in claim 2 wherein said first register and said second register are selected from the group of registers consisting of:
    a flip-flop, and
    a transparent latch.

4. The TDC as recited in claim 1 wherein each of said buffer-delayed clock signal and each of said first gate-delayed clock signal is provided to a TDC on-line calibration circuit.

5. The TDC as recited in claim 4 wherein each of said buffer-delayed clock signal and each of said first gate-delayed clock signal is provided to a non-linearity corrector.

6. The TDC as recited in claim 1 wherein said TDC is implemented by a CMOS process.

7. The TDC as recited in claim 1 wherein said each one of said delay elements further includes a second transmission gate coupled in series with said non-inverting buffer and configured to provide a second gate-delayed clock signal.

8. A system-on-chip (SOC), comprising:
    a time-to-digital converter (TDC), including:
        a chain of delay elements configured to receive a clock signal and generate delayed clock signals, each one of said delay elements having:
            a non-inverting buffer configured to delay said clock signal by about twice a delay of an inverter to provide a buffer-delayed clock signal, and
            a first transmission gate, coupled to said non-inverting buffer, configured to delay said clock signal by about said delay of an inverter to provide a first gate-delayed clock signal.

9. The SOC as recited in claim 8 further comprising a first register configured to latch said first gate-delayed clock signal and a second register configured to latch said buffer-delayed clock signal.

10. The SOC as recited in claim 9 wherein said first register and said second register are selected from the group of registers consisting of:
    a flip-flop, and
    a transparent latch.

11. The SOC as recited in claim 8 wherein each of said buffer-delayed clock signal and each of said first gate-delayed clock signal is provided to a TDC on-line calibration circuit.

12. The SOC as recited in claim 11 wherein each of said buffer-delayed clock signal and each of said first gate-delayed clock signal is provided to a non-linearity corrector.

13. The SOC as recited in claim 8 wherein said each one of said delay elements further includes a second transmission gate coupled in series with said non-inverting buffer and configured to provide a second gate-delayed clock signal.

14. A method of phase detection for use with synthesizing a clock signal, comprising:
    receiving a clock signal at a node;
    employing a non-inverting buffer to delay said clock signal at said node by about twice a delay of an inverter and provide a buffer-delayed clock signal; and
    employing a transmission gate to delay said clock signal at said node by about a delay of an inverter and provide a gate-delayed clock signal.

15. The method as recited in claim 14 further comprising latching said buffer-delayed clock signal and said gate-delayed clock signal.

16. The method as recited in claim 14 further comprising employing an additional transmission gate to further delay said clock signal at said node and provide an additional gate-delayed clock signal.

17. The method as recited in claim 16 wherein said additional transmission gate is coupled in series with said non-inverting buffer.

18. The method as recited in claim 16 further comprising latching said additional gate-delayed elements.

19. A non-linearity corrector for use with a time-to-digital converter (TDC) that receives a clock signal and a frequency reference clock signal, comprising:
    an adder configured to receive a normalized output from a TDC; and
    a corrector applier coupled to said adder and configured to provide a correcting factor to said normalized output based on a raw output of said TDC, said correcting factor based on a TDC transfer function mismatch.

20. The non-linearity corrector as recited in claim 19 wherein said corrector applier provides said correcting factor based on a least significant bit of said raw output.

21. The non-linearity corrector as recited in claim 20 wherein said corrector applier provides said correcting factor when said least significant bit is odd.

22. The non-linearity corrector as recited in claim 19 wherein said correcting factor is based on a relative number of hits of said raw output of said TDC.

23. The non-linearity corrector as recited in claim 19 wherein said correcting factor is positive.

24. A time-to-digital converter (TDC), comprising:
    a chain of non-inverting buffers configured to receive a clock signal and generate delayed clock signals, each of said non-inverting buffers configured to provide a delay of about twice a delay of an inverter to provide a buffer-delayed clock signal; and
    an array of transmission gates, coupled to said chain of non-inverting buffers, configured to provide a delay of about said delay of an inverter to provide a transmission-gate-delayed clock signal.

* * * * *